(12) United States Patent
Schulz et al.

(10) Patent No.: US 7,844,187 B2
(45) Date of Patent: Nov. 30, 2010

(54) OPTICAL COMMUNICATIONS CIRCUIT CURRENT MANAGEMENT

(75) Inventors: Craig Schulz, Fremont, CA (US);
Chihhao Chen, Fremont, CA (US);
David Hui, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 568 days.

(21) Appl. No.: 11/638,177

(22) Filed: Dec. 12, 2006

(65) Prior Publication Data

US 2009/0010655 A1    Jan. 8, 2009

(51) Int. Cl.
*H04B 10/04* (2006.01)

(52) U.S. Cl. ........................ 398/197; 398/195; 398/196; 398/183; 398/182; 398/136; 398/89; 398/90; 398/92; 398/93; 372/32; 372/34; 372/36; 372/38.02

(58) Field of Classification Search ................. 398/197, 398/195, 192, 182, 183, 186, 187, 185, 193, 398/196, 198, 25, 135, 136, 137, 158, 159, 398/164; 385/88, 92, 15, 139, 90, 93, 89; 372/32, 34, 36, 38.02
See application file for complete search history.

(56) References Cited

U.S. PATENT DOCUMENTS

| | | | |
|---|---|---|---|
| 6,590,686 B1 * | 7/2003 | Sekiya et al. | 398/183 |
| 6,976,794 B1 * | 12/2005 | Meyer | 385/88 |
| 7,106,486 B1 | 9/2006 | Nahapetian et al. | |
| 7,200,337 B2 * | 4/2007 | Hosking et al. | 398/136 |
| 7,269,192 B2 * | 9/2007 | Hayashi | 372/34 |
| 2003/0152390 A1 * | 8/2003 | Stewart et al. | 398/135 |
| 2004/0161248 A1 * | 8/2004 | Stewart et al. | 398/196 |
| 2005/0025500 A1 * | 2/2005 | Hallemeier et al. | 398/186 |

OTHER PUBLICATIONS

XFP Revision 4.5—Review Revision—Copyright 2002-2005 by XFP Promoters—See Copyright notice for restrictions, Aug. 31, 2005 (attached front page and pp. 16-17 of the document).*
U.S. Appl. No. 11/394,811, filed Mar. 31, 2006, Inventor, Craig Schultz, entitled"High Data-Rate Optical Modulator Bias Circuit".
Internet search, "Welcome to XFPMSA.org", XFP MSA Group, Sep. 26, 2006, http://www.xfpmsa.org/cgi-bin/home.cgi (1 page).
Information Specification, "10 Gigabit Small Form Factor Pluggable Module", Revision 4.5, Aug. 31, 2005, SFF Committee INF-8077i (SFF p. i—p. xxiv and pp. 1-168).

* cited by examiner

*Primary Examiner*—Hanh Phan
(74) *Attorney, Agent, or Firm*—Blakely, Sokoloff, Taylor & Zafman LLP

(57) ABSTRACT

An optical communications circuit has a communications light signal source and a heat pump coupled to cool the signal source. A controller monitors a current and a temperature of the signal source, and regulates the temperature. The controller updates a heat pump control limit parameter for the heat pump, based on the monitored current. Other embodiments are also described and claimed.

18 Claims, 4 Drawing Sheets

OPTICAL COMMUNICATIONS CIRCUIT CURRENT MANAGEMENT

An embodiment of the invention relates to optical transceivers and transponders, and more particularly, to efficient utilization in such transceivers of maximum available current from a host power supply. Other embodiments are also described.

BACKGROUND

Light waveguide data communications (also referred to here as optical data communications) is becoming increasingly popular due to its advantages in relation to systems that use conductive wires for transmission. Such advantages include resistance against radio frequency interference and higher data rates. An example of a light waveguide transmission system is an optical fiber cable link. Such links are widely used for high speed communications between computer systems. Each system that is attached to the link has a transmitter portion and a receiver portion. The transmitter portion includes electronic circuitry that controls a light source such as a laser, to generate a light signal in the cable that is modulated with information and/or data to be transmitted. The light signal is detected at the receiver portion by a light detector, such as a photodiode, and with the help of appropriate circuitry the received data is then demodulated and recovered.

More recently, pluggable transceiver modules have been developed that can connect the host system board of a data communications network device to other network equipment, via an optical link. The module is powered by the host power supply. One side of the module communicates with an application specific integrated circuit (ASIC) of the host, while the other side has communication signal light sources and detectors that are coupled to an optical waveguide that makes up the optical link. Typically, the link between the ASIC and the transceiver module is a serial electrical link. The transceiver module includes transceiver circuitry, namely a transmitter signal conditioner that translates a serial electrical signal from the ASIC to a driver signal that is fed to drive the communications light source, which may include a laser diode. In addition, there is receiver circuitry which includes a light detector (e.g., a photodiode) that converts the communications light signal from the optical link into an electrical signal, followed by a receiver signal conditioner that further translates the output of the light detector into a serial data communications signal that is directed to the ASIC.

In addition to the basic transmitter and receiver circuitry described above, a modern optical transceiver module also has a capability of managing the operation of the module, including stabilizing the laser diode for operation within tight tolerance bands, for high performance. This is because the operating wavelength of the laser diode can vary greatly as a function of temperature. Accordingly, feedback control systems have been implemented in such transceiver modules, to stabilize the operating temperature of the laser diode, for more reliable data transmission. To achieve precise control of the temperature, an active heat pump, such as a thermoelectric cooler (TEC), has been integrated with an externally modulated laser (EML) component of the transceiver. A closed loop control system in the module monitors the temperature of the EML and regulates it, by suitably controlling the thermo electric cooler to provide the needed heating or cooling effect. This is used to quickly bring the laser diode up to temperature upon startup of the module, and to regulate the temperature within a tight tolerance band during module operation.

In addition to the challenges above, manufacturers of optical transceiver modules may wish to comply with an industry standard agreement that specifies a maximum current that can be provided to the module by the host. The control system in the module thus needs to ensure that the maximum power supply current that has been specified is not exceeded during operation.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Figure 1:
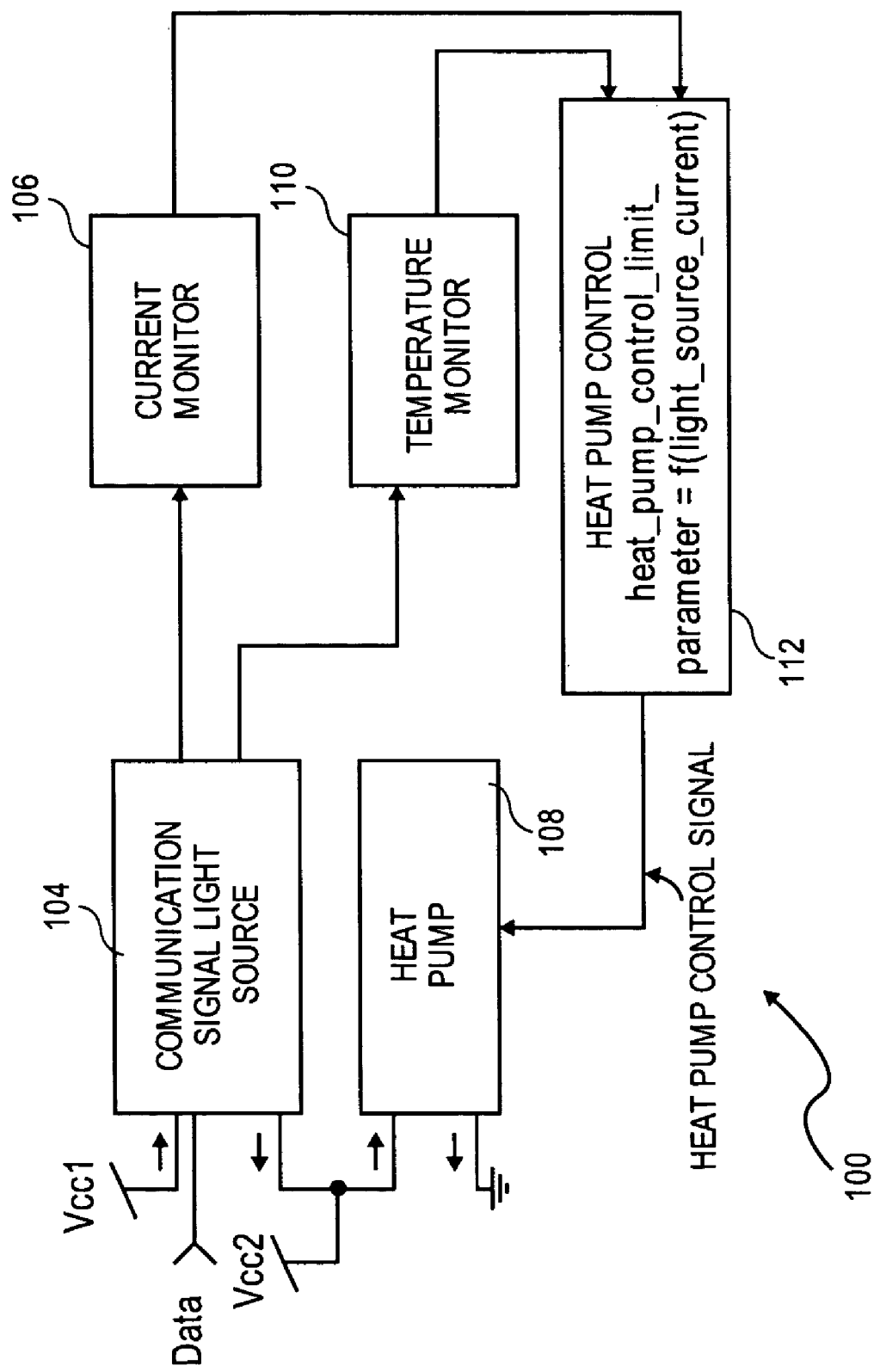
FIG. 1 shows a block diagram of an optical communications circuit, in accordance with an embodiment of the invention.

FIG. 1 is a block diagram of an optical communications circuit 100, in accordance with an embodiment of the invention. The circuit 100 may be part of a transceiver circuit (also referred to as a transponder circuit), that may essentially be viewed as an adapter between an electrical host circuit and an optical communications link. The term "transceiver" refers to a circuit that combines a transmitter and a receiver within a single housing, either on-chip with a host system or in a separate module. As used here, the term also refers to a transponder that may or may not have a serializer/deserializer circuit integrated in its host or ASIC side. The circuit 100 has a communications signal light source 104 that generates the signal that will be launched into an optical communications waveguide (not shown), such as an optical fiber. An electrical current powers or drives the light source 104, where this current is monitored by a current monitor 106. The light source 104 is coupled to be powered through a first host power supply terminal, which is at a supply voltage Vcc1. This terminal supplies current to the circuit 100 from an external or host power supply circuit (not shown). The light source 104 is also coupled to a power return terminal, shown in FIG. 1 by the symbol Vcc2. The current needed to power, bias or drive the light source 104 is thus sourced from the first power supply terminal at Vcc1, and essentially returned to the terminal at Vcc2.

As mentioned above, a high performance light source 104, such as an EML, should be temperature stabilized. This is achieved by providing a heat pump 108 that is coupled to heat and cool the light source 104. The heat pump 108 is powered through a second host power supply terminal, which also happens to be a return terminal of the light source 104, at a supply voltage Vcc2. The two supply terminals can be assigned the same voltage (e.g., the same voltage node), or they can be assigned different voltages generated by different power supply circuits of the host system. A further power return terminal, indicated by a ground symbol, is provided, to be used by the heat pump 108 and, indirectly, by the light source 104.

To achieve temperature stabilization, a temperature of the light source 104 is monitored by a temperature monitor 110. A feedback control loop is implemented that regulates the light source temperature, as a function of the monitored light source current and the monitored light source temperature. This feedback control loop may include at least the light source 104, its monitored current and temperature, the heat pump control process 112, and the heat pump 108. A controller, depicted in FIG. 1 as the combination of the current monitor 106, temperature monitor 110, and heat pump control process 112, generates a heat pump control signal that is applied to the heat pump 108. The signal commands the heat pump to heat or cool, and at what level.

Over time, as a feedback loop is operating, the heat pump control process 112 updates, e.g. periodically, a heat pump control limit parameter, based on the light source current measured at that moment. This parameter sets the maximum current that should be drawn by the heat pump 108. The parameter thus indicates the maximum level of heating or cooling for which the heat pump 108 can be signaled, during operation of the communications circuit 100. As explained below, this scheme allows the circuit 100 to take advantage of the maximum specified or available current from the power supply terminals, provided by the host system, for improved performance of the circuit 100. This is particularly beneficial in instances where the heat pump 108 requires a significant amount of current to cool the light source 104 down to the desired operating temperature, when the ambient or case temperature of the light source 104 is relatively high.

The heat pump control process 112 adjusts the maximum level of current that can be drawn (through Vcc2) by the heat pump 108 for maintaining the desired temperature set point for the light source 104. The heat pump control limit parameter (or heat pump current limit) is needed to prevent the total current draw of the circuit 100, from the supply terminal Vcc2, from exceeding a specified maximum. The current limit for the heat pump 108 should be set as high as possible, to allow operation of the light source 104 during higher case temperatures (i.e., the temperature of the case in which the light source 104 is housed). Setting this current limit as high as possible also helps shorten the time it takes for the temperature of the light source 104 to reach and stabilize at its nominal operating level, during initial start-up when the case of the light source 104 is relatively cold. An example of how such rules are applied in the heat pump control process 112, to modify the current limit of the heat pump 108 based on the monitored light source current, will be given below in connection with FIG. 2.

Figure 2:
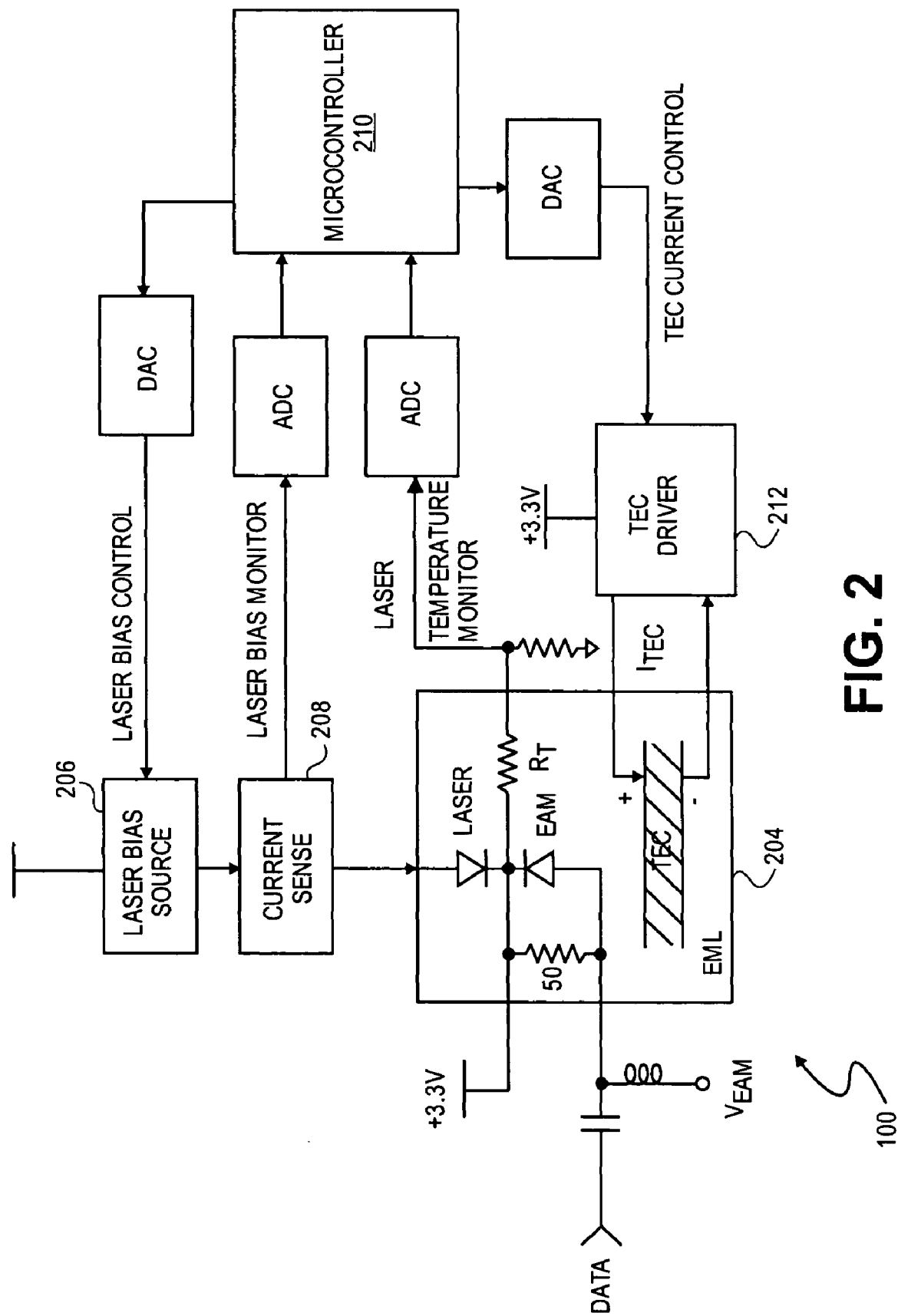
FIG. 2 shows a combined block and circuit schematic diagram of the communications circuit, which uses an externally modulated laser (EML).

In turning to FIG. 2, one implementation of the communications circuit 100 is shown that uses an externally modulated laser (EML) 204. The laser may be a distributed feedback (DFB) laser. The EML 204 has a laser diode that is coupled to an electro absorptive modulator (EAM), as shown. The light output of the laser is modulated by the EAM, in accordance with an input DATA signal. The input DATA signal contains a serial stream of information to be transmitted by the laser, where this serial stream may be received from electrical circuitry in the host system (not shown), and in particular via a serializer/deserializer circuit (not shown).

More particularly, the cathode terminals of the laser diode and the EAM are tied to a host power supply terminal that is at 3.3 VDC. The EAM anode is set to a non-negative voltage, which is less than the cathode voltage to provide the proper reverse bias for EAM operation. This EAM bias configuration eliminates the requirement for a negative power supply voltage or power converter, to operate the circuit 100. A bias circuit (not shown) provides the needed voltage $V_{EAM}$ at the EAM anode.

In the particular implementation of FIG. 2, although the EAM cathode is tied to the +3.3 VDC supply terminal, the laser forward bias current (set by a laser bias source circuit 206) is derived from another host power supply terminal, which is at a greater voltage, in this case +5 VDC. The current, supplied by this power supply terminal to bias the laser diode, is set by the laser bias source circuit 206, and flows through the laser and into the +3.3 VDC power supply rail. Note that the invention should not be limited to these voltage values, as the circuit 100 can also operate at other supply voltages.

To stabilize the operating temperature of the EML 204, an integrated TEC is provided as a heat pump. The TEC draws a current $I_{TEC}$, provided by a TEC driver 212 that is powered by the 3.3 VDC rail. The driver 212 regulates the TEC current, to a value that has been commanded by a microcontroller 210. In this particular implementation, the driver 212 receives an analog, TEC current control signal from the microcontroller, via a digital to analog converter (DAC). The microcontroller 210 monitors a temperature of the EML 204 by collecting a sensed and digitized (via an analog-to-analog converter, ADC) laser temperature value, in this case using a thermistor $R_T$ embedded in the EML 204. The microcontroller 210 adjusts the TEC current to maintain a desired, laser temperature set-point. The microcontroller 210 may also be used to manage other aspects of the circuit 100, including, for example, setting the laser bias current via the laser bias source circuit 206. The microcontroller 210 can turn off transmission into the optical waveguide, by commanding that the laser bias current be turned off. The microcontroller 210 monitors the laser bias current by collecting a sensed and digitized current value (using in this case the series coupled current sense circuit 208).

The microcontroller 210 has firmware that maintains a TEC current control limit parameter. As suggested above, this parameter is needed to prevent the total current draw of the circuit 100, from a host power supply terminal and, in particular, the +3.3 VDC terminal, to exceed a maximum specified level. As described below in connection with FIG. 3, this maximum specified level may be part of a multi source agreement (MSA) that may be entered into by various manufacturers of small form factor, optical transceiver modules (in which the circuit 100 would be incorporated).

As a general principle, the TEC current limit should be set as high as possible to allow a higher EML case temperature during operation. A higher TEC current limit gives the TEC greater cooling capability. Analogously, the higher TEC current limit may also give the TEC greater heating capability, and this helps shorten the time it takes for the laser to be brought up to temperature and stabilized, during initial start-up of the EML. The following example describes how the TEC current control limit parameter may be implemented and used in the circuit 100 of FIG. 2, as part of an optical transceiver module.

During module start-up, the laser bias is turned off while the TEC is driven as required to stabilize the laser temperature at the desired set-point. The TEC current limit is set to maximize TEC current, while preventing excessive current draw from the 3.3 VDC rail. Once the laser temperature has stabilized, the laser bias is turned on. Because of the relatively high impedance presented at the node to which the cathodes are tied, essentially all of the laser bias current is steered into the 3.3 VDC supply rail, thereby reducing by an equivalent amount the current draw from the host supply on that supply rail. The laser bias current can be "re-used", in the configuration of FIG. 2, to supply the TEC driver 212 through the 3.3 VDC terminal, thereby reducing the module's current draw from that terminal. In other words, essentially all of the laser bias current that is sourced from the 5 VDC rail can be used to drive the TEC, beyond the conventional, "laser off" TEC current limit. To explain further, when the laser bias is turned off, the TEC current draw is solely from the 3.3 VDC terminal, not the 5 VDC terminal. The maximum TEC current in that case is limited by the maximum current that is available from the host through the 3.3 VDC terminal only. However, when the laser bias is turned on, in addition to the specified maximum draw from the 3.3 VDC supply, the TEC driver 212 has at its disposal essentially all of the laser bias current (sourced from the +5 VDC supply).

To take advantage of the realization above, namely that the TEC can be driven beyond the conventional, laser off, TEC current limit, the microcontroller 210 contains firmware that uses an equation to modify the TEC current limit, based on a laser bias monitor reading. This permits full utilization of the current that is allowed on the 3.3 VDC supply rail, which helps shorten the laser turn on time and obtain more cooling capacity from the TEC. The equation used may be as follows:

$$I_{Limit} = I_{Limit0} + I_{LsBias} * K$$

where $I_{Limit}$ is the TEC current limit, $I_{Limit0}$ is the TEC current limit with the laser bias turned off, and $I_{LsBias}$ is the laser current as measured by the laser bias monitor. K is a scaling factor that adjusts for the conversion of the power supply current into the TEC driver 212, to the TEC current ($I_{TEC}$) The driver 212 may be a switching type of DC/DC converter. The value of the scaling factor K also depends on the TEC current-voltage (I-V) characteristics. Additional terms may be added to the equation above, to, for example, account for the finite impedance presented at the common cathode node.

The equation above thus shows that the heat pump control limit parameter (taken to be $I_{LIMIT}$ in this case) is a function of a preset heat pump control limit value, and a scaling factor that is applied to the monitored light source current. In particular, the parameter, as given by the equation above, is a linear combination of a preset heat pump control level and a scaled proportion of the monitored light source current. The equation shows that the TEC current limit increases when the laser current is non-zero, and this increase is determined by the scaling factor K and the laser bias current.

An example pseudo-code for the firmware in the microcontroller 210, to perform the current management scheme described above, is as follows:

In the pseudo-code above, the parameter which limits the maximum current that can be consumed by the heat pump is max_tec_voltage. The communications signal light source current that is monitored is laser_bias. The scaling and conversion factor K is TEC_bias_scalor. The preset heat pump control level is given by preset_tec_voltage_limit. The TEC control voltage is a DAC output voltage, and this is estimated, namely computed and/or looked up, by a suitable control loop, such as a proportional-integral (PI) control loop, based on a real time laser temperature reading and a target laser temperature set-point.

The pseudo-code shows how the maximum allowable TEC control voltage is limited by the limit derived for TEC_DAC_val. The variable NOMINAL_LEVEL is the nominal TEC voltage level, which is the voltage resulting in essentially no cooling or heating by the TEC, corresponding typically to zero TEC current.

It can be seen that the pseudo-code limits an applied heat pump control level (TEC_DAC_val) to the sum of a nominal heat pump control level (NOMINAL_LEVEL) and the heat pump control limit parameter (max_tec_voltage). The pseudo-code above is one of several other possible ways in which a heat pump control signal that is governed by a heat pump control limit parameter, can be generated.

Figure 3:
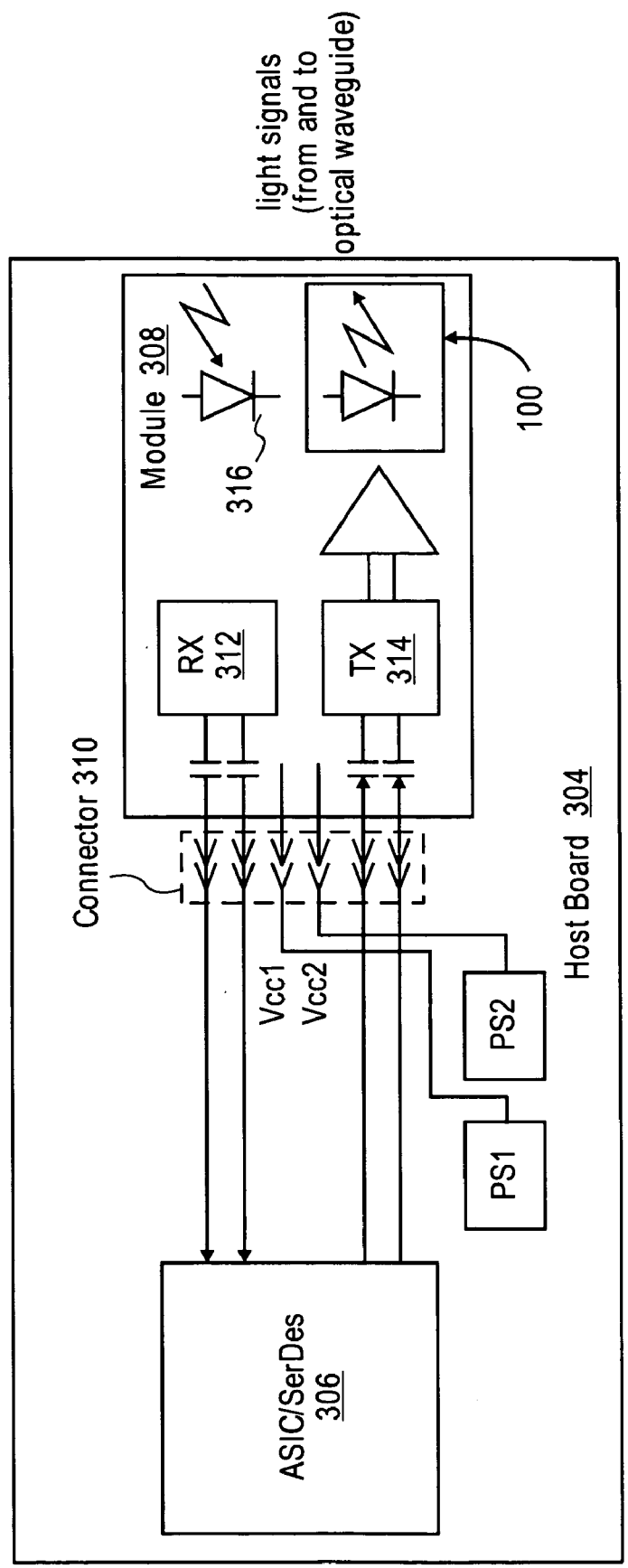
FIG. 3 is a diagram of a system application of the optical communications circuit.

It was suggested above that the communications circuit 100 could be incorporated into an optical communications transceiver module. FIG. 3 shows such an embodiment of the invention. FIG. 3 depicts a host board 304, which may be a host system board such as a personal computer motherboard, bearing an ASIC/SerDes (serializer/deseralizer) circuit 306 to which a transceiver module 308 is coupled. The module 308 may be an XFP module, which is an example of a pluggable, small form factor, optical communications transceiver module whose specifications are governed by a multi source agreement (MSA). The module 308 is coupled to the ASIC/SerDes 306 by an electrical connector 310. The connector 310 supports a pair of one-way, serial differential links (allowing for two-way communications between the host and the module 308). The connector 310 also provides at least two power supply terminals, labeled as Vcc1 and Vcc2, as well as one or more power return terminals (not shown), that deliver current from two different power supply circuits (PS1) and (PS2) that are on the host board 304.

```
//Maximum TEC control voltage is essentially the summation of preset level and
//scaled proportion of laser bias current
max_tec_voltage = Preset_TEC_voltage_limit + (laser_bias * TEC_bias_scalor);
//TEC control voltage (DAC output) is derived from a proportional-integral (PI)
//control loop based on
// real time laser temperature and target laser temperature setpoint
TEC_DAC_val + PI_Control_Loop(laser_temp, target_temp).
//Limiting maximum allowable TEC control voltage by the limit derived above.
//Normal TEC voltage level is the voltage resulting in zero TEC current (no cooling
//or heating)
if (TEC_DAC_val > (NOMINAL_LEVEL + max_tec_voltage))
{
    TEC_DAC_val = (NOMINAL_LEVEL + max_tec_voltage);
}
else if ((TEC_DAC_VAL < (NOMINAL_LEVEL – max_tec_voltage))&&
(NOMINAL_LEVEL > max_tec_voltage))
{
    TEC_DAC_val = (NOMINAL_LEVEL – max_tec_voltage);
}
//Update DAC value
dac_out = TEC_DAC_val;
```

The module 308 has a receiving signal conditioning circuit 312 that is coupled to translate the electrical signal provided by a photo detector 316, into the differential signal that is transmitted to the ASIC/SerDes 306. For the transmit side, the module 308 has a transmit signal conditioning circuit 314 that translates a received differential signal from the ASIC/SerDes 306 into the DATA signal that is input to the optical communications circuit 100 (see FIG. 2). The light signals processed by the detector 316 and circuit 110 are obtained from and sent to one or more optical waveguides (not shown) that make up the optical communications link.

It should be noted that the connector 310 may also support additional communication paths, between the ASIC/SerDes 306 and the module 308, dedicated for communications with the microcontroller 210 that is part of the optical communications circuit 100. These paths may be used to program the microcontroller 210, as well as obtain diagnostic reports from the microcontroller regarding the status and overall health of the communications light signal source in the module 308. Other system applications of the optical communications circuit 100 are possible, including its integration within a transceiver circuit that is part of a permanent optical I/O interface of the host system, as opposed to the pluggable module 308.

Figure 4:
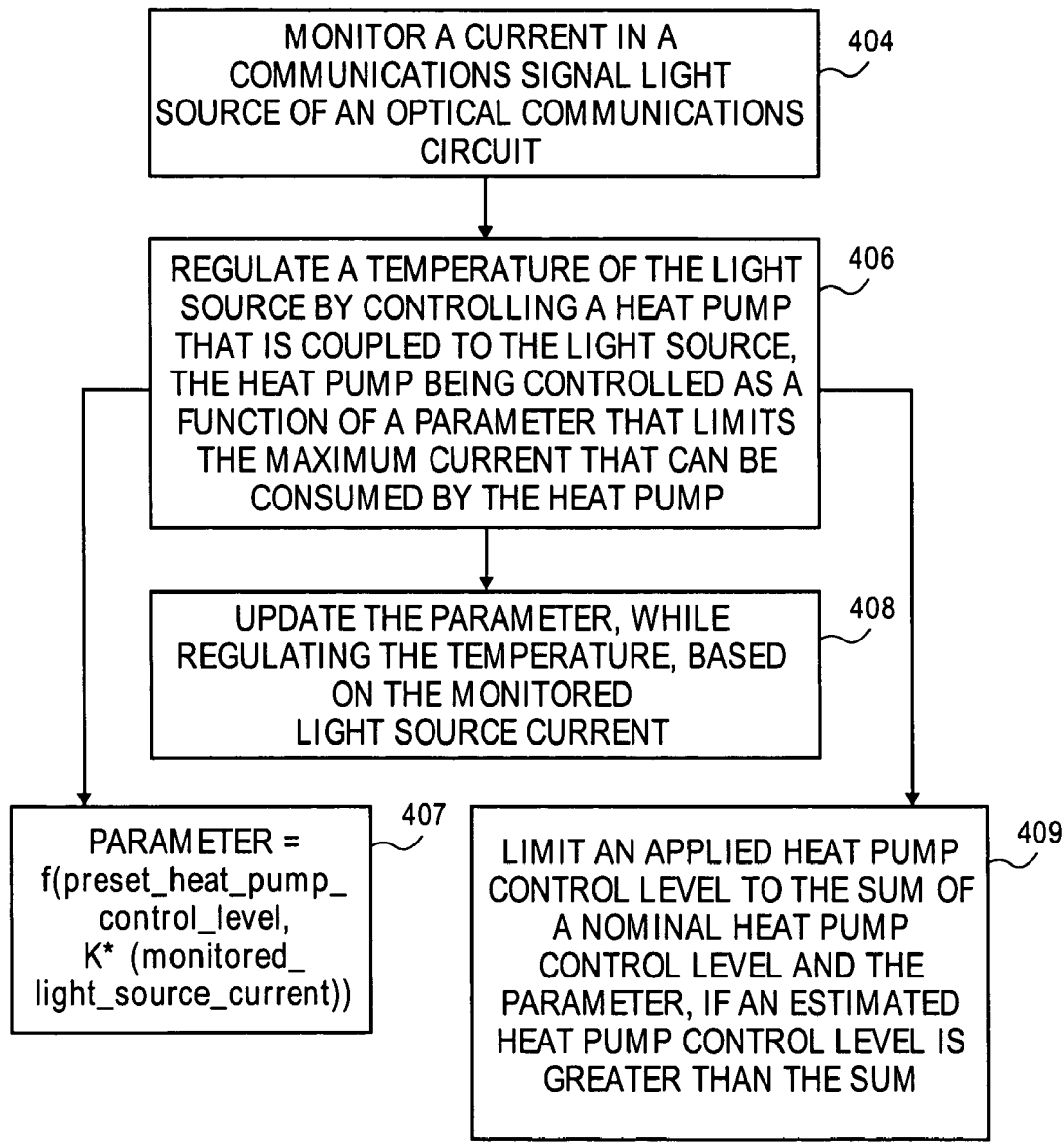
FIG. 4 is a flow diagram of a method for optical communications, in accordance with an embodiment of the invention.

Turning now to FIG. 4, a method for managing current in an optical communications circuit, in accordance with an embodiment of the invention, is depicted in flow diagram form. The communications circuit may be in accordance with FIG. 1 or FIG. 2 described above. The operations described may be performed by any suitable combination of hardware and software that may be integrated, together with the communications circuit, in a transceiver module. The method involves monitoring a current in a communications signal light source of the circuit (operation 404). This monitoring of the current may involve sensing a laser diode bias current, and digitizing and storing the sensed value in some form of memory. This data collection may be performed periodically, or otherwise repeatedly and automatically, once the optical communication circuit has been powered up.

In addition, a temperature of the light source is regulated, by controlling a heat pump that is coupled to the light source (operation 406). This regulation may occur upon initial startup, where the temperature of the light source is raised and then stabilized at some nominal operating level. The regulation may also refer to maintaining the temperature at the nominal level during normal operation of the communications circuit. The heat pump will thus be commanded to heat or cool as needed, depending upon a sensed temperature of the light source. This control of the heat pump is a function of a Parameter, which limits the maximum current that can be consumed by the heat pump. As given in block 407, the Parameter may be a function of a preset heat pump control level, and a scaling factor K that is applied to the monitored light source current. The Parameter is updated (operation 408), while regulating the temperature, based on the monitored light source current.

The operations of 404-408 may be repeatedly performed, as part of a closed loop process that regulates the temperature of the light source. In so doing, the process may limit an applied heat pump control level to the sum of a nominal heat pump control level and the Parameter, if an estimated heat pump control level is greater than the sum (operation 409). When combined with the particular circuit implementation of FIG. 2 in which the laser diode of an EML has its cathode tied to that of an EAM, and the laser bias current, sourced from a higher host power supply rail, is fed into the a lower host power supply rail that powers the heat pump, greater cooling and heating may be obtained from the heat pump without exceeding the specified maximum current draw from the lower power supply terminal.

The invention is not limited to the specific embodiments described above. For example, the ASIC/SerDes circuit 306 in FIG. 5 could, alternatively, be integrated into the transceiver module 308. Accordingly, other embodiments are within the scope of the claims.

What is claimed is:

1. An optical communications circuit comprising:
 a communications light signal source;
 a heat pump coupled to heat and cool the signal source; and
 a controller coupled to the signal source and the heat pump, to monitor a current and a temperature of the signal source and regulate the temperature, the controller to increase a heat pump control limit parameter for the heat pump when the monitored current is non-zero and based on the monitored current, wherein the heat pump control limit parameter sets maximum current that can be drawn by the heat pump.

2. The circuit of claim 1 wherein the parameter comprises a combination of a preset heat pump control limit and a scaled proportion of the monitored current.

3. The circuit of claim 1 wherein the signal source comprises an externally modulated laser (EML) in which a laser diode is coupled to an electro-absorptive modulator (EAM), and wherein the monitored current includes a bias current of the laser diode.

4. The circuit of claim 3 wherein the heat pump comprises a thermo-electric cooler (TEC) coupled to a TEC driver, the TEC driver having a TEC control input coupled to the controller to receive a signal that is governed by the heat pump control limit parameter.

5. The circuit of claim 3 further comprising:
 a first power supply terminal; and
 a second power supply terminal to provide a lower power supply voltage than the first terminal,
 wherein cathode terminals of the laser diode and the EAM are tied to the second power supply terminal, and the laser diode bias current is provided by the first power supply terminal.

6. An apparatus comprising:
 an optical communications transceiver circuit having
  a first host power supply terminal;
  a second host power supply terminal, wherein the first and second power supply terminals provide different power supply voltages;
  a communications signal light source coupled to be powered through the first host power supply terminal;
  a heat pump coupled to heat and cool the light source while powered through the second host power supply terminal; and
  a controller coupled to the light source to monitor a light source current and a light source temperature, the controller being further coupled to the heat pump to control the heat pump, the controller to operate a feedback control loop that regulates the light source temperature and, in so doing, increases a heat pump control limit parameter when the monitored light source current is non-zero and based on the monitored light source current, wherein the heat pump control limit parameter sets a maximum current that can be drawn by the heat pump.

7. The apparatus of claim 6 wherein the light source comprises an externally modulated laser (EML) having a laser diode coupled to an electro absorptive modulator (EAM).

8. The apparatus of claim 7 wherein the first and second power supply terminals provide different power supply voltages, and wherein cathode terminals of the laser diode and the EAM are tied to the second power supply terminal, and the laser diode's bias current is provided by the first power supply terminal.

9. The apparatus of claim 6 wherein the heat pump control limit parameter is a function of a preset heat pump control limit value and a scaling factor that is applied to the monitored light source current.

10. A method for managing current in an optical communication circuit, comprising:
monitoring a current in a communications signal light source of an optical communications circuit;
regulating a temperature of the communications signal light source by controlling the level of current consumed by a heat pump that is coupled to the light source; and
while regulating the temperature, increasing a parameter that sets the maximum level of current that can be consumed by the heat pump, when the monitored light source current is non-zero and based on the monitored light source current.

11. The method of claim 10 wherein the parameter comprises a combination of a preset heat pump control level and a scaled proportion of the monitored light source current.

12. The method of claim 10 wherein said regulating the temperature comprises:
limiting an applied heat pump control level to the sum of a) a nominal heat pump control level and b) the parameter, if an estimated heat pump control level is greater than said sum,
wherein the nominal heat pump control level, when applied to the heat pump, results in essentially no cooling action and no heating action by the heat pump.

13. A system comprising:
a host system board; and
a pluggable, optical communications transceiver module coupled to the host system board, the module having firmware that monitors a current of a communications signal light source of the module, regulates a temperature of the communications signal light source by controlling a heat pump that is coupled to the light source, and, while regulating the temperature, increases a parameter that sets a maximum current that can be drawn by the heat pump, when the monitored light source current is non-zero and based on the monitored light source current.

14. The system of claim 13 further comprising a host card coupled to the host system board, wherein the module is plugged into the host card.

15. The system of claim 13 wherein the communications signal light source comprises an EML in which a laser diode is coupled to an EAM, wherein the monitored light source current comprises a bias current of the laser diode.

16. The system of claim 15 wherein the module has first and second host power supply terminals that provide different supply voltages, wherein cathode terminals of the laser diode and the EAM are tied to the second power supply terminal, and the laser diode bias current is provided by the first power supply terminal.

17. The system of claim 13 wherein the parameter comprises a combination of a preset heat pump control level and a scaled proportion of the monitored light source current.

18. The system of claim 13 wherein the module further comprises a host side serializer/deserializer circuit.

\* \* \* \* \*